United States Patent
Dorn et al.

(10) Patent No.: US 10,461,663 B2
(45) Date of Patent: Oct. 29, 2019

(54) METHOD FOR DISCHARGING AN ELECTRIC ENERGY STORAGE UNIT

(71) Applicant: SIEMENS AKTIENGESELLSCAHFT, Munich (DE)

(72) Inventors: Joerg Dorn, Buttenheim (DE); Daniel Schmitt, Postbauer-Heng (DE); Frank Schremmer, Fuerth (DE); Marcus Wahle, Veitsbronn (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 16/329,958

(22) PCT Filed: Sep. 5, 2016

(86) PCT No.: PCT/EP2016/070832
§ 371 (c)(1),
(2) Date: Mar. 1, 2019

(87) PCT Pub. No.: WO2018/041370
PCT Pub. Date: Mar. 8, 2018

(65) Prior Publication Data
US 2019/0199237 A1   Jun. 27, 2019

(51) Int. Cl.
*H02M 7/162* (2006.01)
*H02M 7/49* (2007.01)
(Continued)

(52) U.S. Cl.
CPC ........ *H02M 7/49* (2013.01); *H03K 17/08148* (2013.01); *H03K 17/723* (2013.01);
(Continued)

(58) Field of Classification Search
CPC ...... H02M 7/49; H02M 7/162; H02M 7/5387; H02M 7/53846; H02M 7/1225;
(Continued)

(56) References Cited

U.S. PATENT DOCUMENTS 7,561,408 B2   7/2009   Pezzani
7,602,157 B2 *  10/2009   Babcock ................ H02P 7/281
318/400.22
(Continued)

FOREIGN PATENT DOCUMENTS

DE   102005040543 A1   3/2007
DE   102014200108 A1   7/2015
(Continued)

*Primary Examiner* — Adolf D Berhane
(74) *Attorney, Agent, or Firm* — Laurence Greenberg; Werner Stemer; Ralph Locher

(57) ABSTRACT

An electric energy storage device which is connected to an electronic circuit is discharged by way of a first and a second electric conductor. A thyristor is provided for discharging the energy storage device. As a result of a fault occurring in the electronic circuit, a discharge current of the energy storage device begins to flow from the energy storage device to the electronic circuit via the first electric conductor and back to the energy storage device via the second electric conductor. The discharge current causes a magnetic field which changes over time to be generated about the first electric conductor and the second electric conductor. The magnetic field penetrates the semiconductor material of the thyristor. By virtue of the temporally varying magnetic field, a current is induced in the semiconductor material of the thyristor, and the thyristor is activated by the induced current.

16 Claims, 9 Drawing Sheets

(51) Int. Cl.
*H03K 17/0814* (2006.01)
*H03K 17/723* (2006.01)
*H02M 7/483* (2007.01)
*H02M 1/32* (2007.01)

(52) U.S. Cl.
CPC ............... *H02M 2001/322* (2013.01); *H02M 2007/4835* (2013.01)

(58) Field of Classification Search
CPC ......... H02M 7/1255; H02M 2001/322; H02M 2007/4835; H03K 17/08148; H03K 17/723
See application file for complete search history.

(56) References Cited

U.S. PATENT DOCUMENTS

| | | | |
|---|---|---|---|
| 2008/0232145 A1 | 9/2008 | Hiller et al. | |
| 2017/0012521 A1* | 1/2017 | Jimichi | H02M 7/483 |
| 2018/0083550 A1* | 3/2018 | Chung | H02M 1/32 |
| 2018/0166994 A1* | 6/2018 | Dorn | H02H 9/04 |
| 2019/0028020 A1* | 1/2019 | Chen | H02M 5/4585 |
| 2019/0044620 A1* | 2/2019 | Alvarez Valenzuela | G08C 23/06 |
| 2019/0106002 A1* | 4/2019 | Gotz | H02P 29/0241 |
| 2019/0131885 A1* | 5/2019 | Dorn | H02M 7/483 |

FOREIGN PATENT DOCUMENTS

| | | |
|---|---|---|
| EP | 1427107 A1 | 6/2004 |
| WO | 2013044961 A1 | 4/2013 |

* cited by examiner

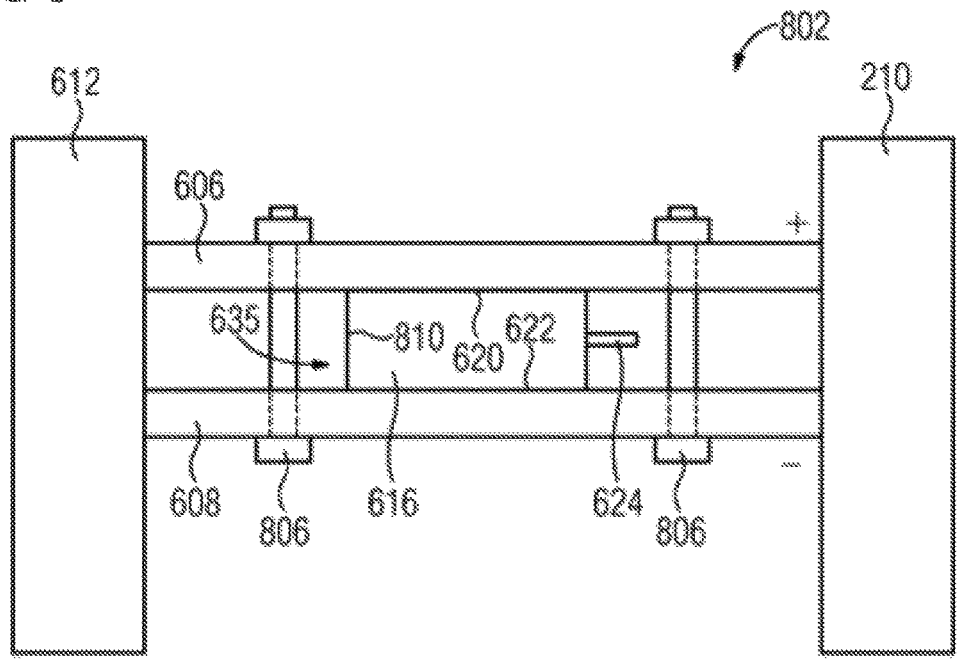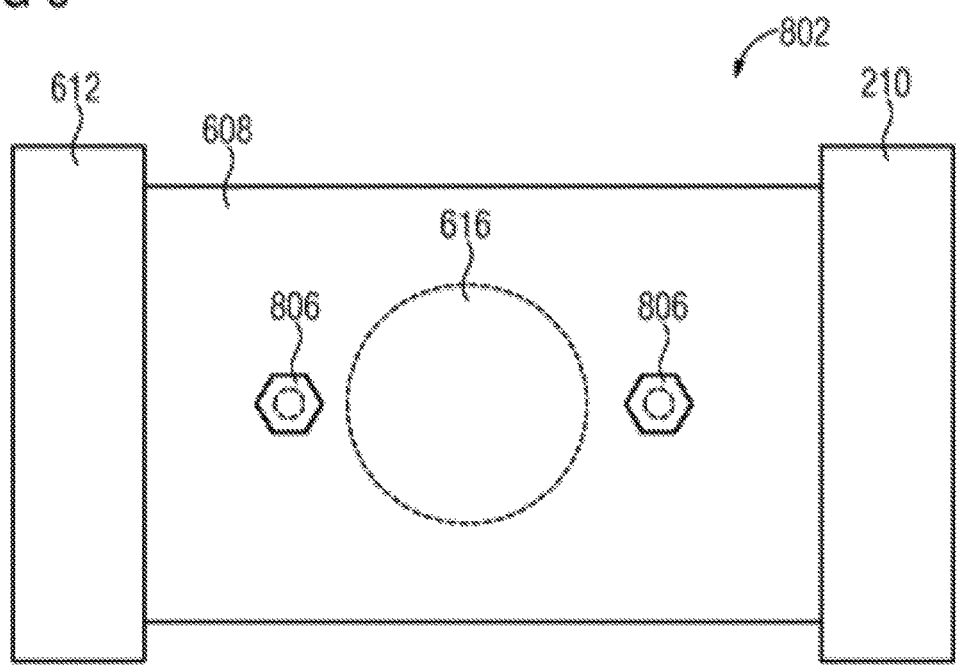

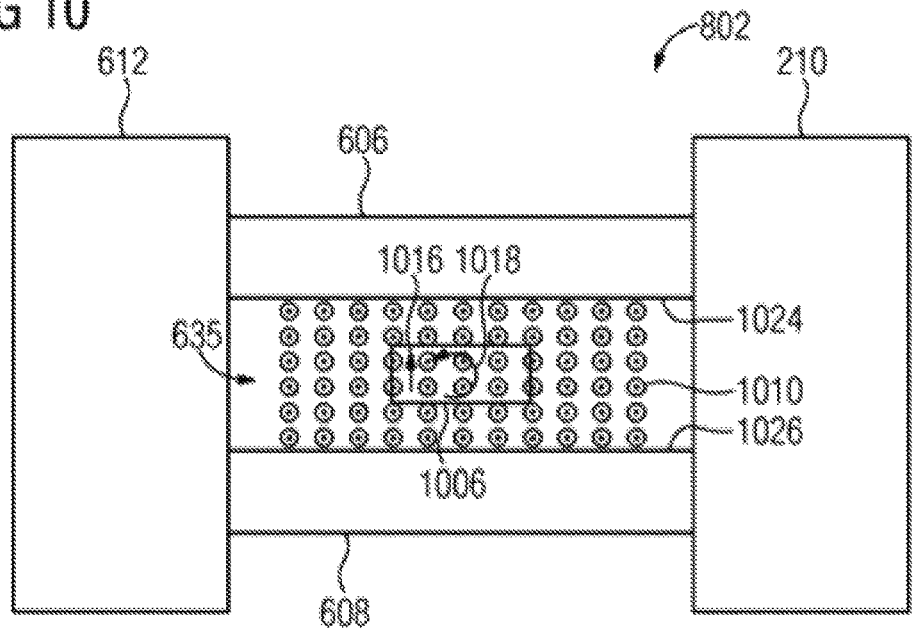
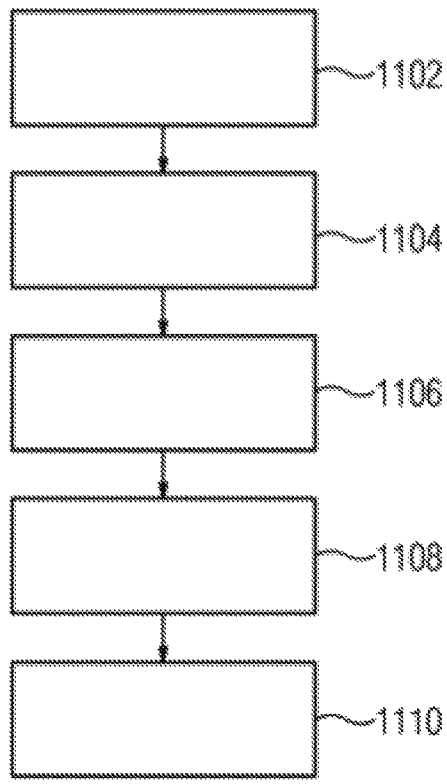

METHOD FOR DISCHARGING AN ELECTRIC ENERGY STORAGE UNIT

BACKGROUND OF THE INVENTION

Field of the Invention

The invention relates to a method for discharging an electric energy storage unit. Large amounts of energy can be stored in electric energy storage units (for example in electrical capacitors). These large amounts of energy may be difficult to manage in the event of a fault since the energy may be released in an uncontrolled manner and suddenly in the event of a fault and, thereupon, may be converted into different forms of energy. An electronic circuit or component (for example a power semiconductor) connected to the electric energy storage unit is then often unable to absorb and control these amounts of released energy. This can result in the electronic circuit being completely destroyed in the event of a fault, for example as a result of an explosion. In the event of destruction of the electronic circuit, there may also be consequential damage to adjacent operating means. Causes of such consequential damage may be, for example, electric arcs, high electromagnetic forces or else significant contamination owing to the mentioned explosion.

The international patent application WO 2013/044961 A1 discloses short-circuit current load relief for a submodule of a modular multilevel converter. In said document, a thyristor is connected in parallel with an electrical capacitor in order to conduct away the discharge current of the capacitor in a controlled manner through the thyristor in the event of a fault and to protect the electronic circuit connected to the capacitor. This known short-circuit current load relief has an electronic evaluation circuit, which identifies the presence of a fault and, in the event of the presence of a fault, introduces a gate current into the gate terminal of the thyristor so that the thyristor switches on/turns on. In order to implement this evaluation circuit, additional electronic components are required, and the evaluation circuit requires a certain period of time in order to identify the fault and provide the gate current for the thyristor. In addition, the evaluation circuit reduces the reliability of the protective element, i.e. the short-circuit current load relief.

The invention is based on the object of specifying a method for discharging an electric energy storage unit and an arrangement in which no additional evaluation circuit is required.

SUMMARY OF THE INVENTION

This object is achieved according to the invention by a method and an arrangement as claimed in the independent patent claims. Advantageous embodiments of the method and the arrangement are specified in the dependent patent claims.

A method is disclosed for discharging an electric energy storage unit, which is connected to an electronic circuit by means of a first electrical conductor and a second electrical conductor, wherein a thyristor is provided for discharging the energy storage unit (in the event of a fault), wherein in the method owing to a fault which has occurred in the electronic circuit (in particular owing to a short circuit which has occurred in the electronic circuit), a discharge current of the energy storage unit begins to flow from the energy storage unit via the first electrical conductor to the electronic circuit and via the second electrical conductor back to the energy storage unit, owing to the (increasing) discharge current, a magnetic field which changes over time is generated around the first electrical conductor and the second electrical conductor, said magnetic field passing through the semiconductor material of the thyristor, a current (eddy current) is induced (impressed) in the semiconductor material of the thyristor by the magnetic field which changes over time, and the thyristor is switched on (exclusively) by this induced current (as a result of which the discharge current of the energy storage unit flows through the switched-on thyristor and is thus conducted past the electronic circuit). The switched-on thyristor therefore takes on the discharge current of the energy storage unit (at least a substantial proportion of the discharge current of the energy storage unit), i.e. the switched-on thyristor conducts away the discharge current of the energy storage unit. The energy storage unit may be, for example, a capacitor-type energy storage unit, for example an electrical capacitor, an electric battery or a rechargeable electric battery. The induced current can act as a gate current or as a trigger current in the thyristor. The gate current is a current which flows through the gate semiconductor structure of the thyristor and switches on the thyristor; the trigger current is a current which flows in the thyristor outside the gate semiconductor structure of the thyristor and switches on the thyristor.

In other words, the thyristor is switched on by the induced current (eddy current). As a result, the discharge current of the energy storage unit flows through the switched-on thyristor, circumventing the electronic circuit. In this case, the thyristor can be arranged physically adjacent to the first electrical conductor and/or the second electrical conductor.

In this method, it is particularly advantageous that the magnetic field which changes over time (and which arises owing to the increasing discharge current of the energy storage unit) is used directly to switch on the thyristor (i.e. to trigger the thyristor). For this purpose, no further components and also no further evaluation circuit are required. As a result, this method can be implemented very easily, inexpensively and reliably. In addition, time delays during switching-on of the thyristor are avoided (an evaluation circuit consisting of additional electronic components would naturally bring with it such delays). What is discussed here is therefore a self-triggering thyristor without an additional switching delay time owing to additional detection or trigger electronics in an additional evaluation circuit (the trigger delay time of the thyristor in this case remains unchanged: the trigger delay time of the thyristor is generally in the range of a few μs, typically 1-3 μs). Owing to the absence of additional components and an additional evaluation circuit, no additional electrical losses occur either. In particular in the case of a power electronics system in which a very great number of electric energy storage units are present (such as, for example, in the case of a modular multilevel converter), the electrical losses can thus be reduced to a notable extent. As a result, the energy efficiency of the system can be improved. In the described method, only low electrical losses are caused by the leakage current of the thyristor; this leakage current is generally very low.

The described method therefore makes great cost savings and a reduction in the FIT rate (FIT=failure in time) possible owing to the avoidance of additional electronic components or the avoidance of an additional electronic evaluation circuit. Since the components not provided cannot become defective, the probability of the occurrence of a fault is markedly reduced.

The method can proceed such that the thyristor is switched on by the induced current when the change in the magnetic field over time exceeds a threshold value. This threshold value can be significantly influenced by selection of the physical arrangement of the thyristor with respect to the first electrical conductor and/or the second electrical conductor. The greater, for example, the distance between the thyristor and the first electrical conductor or the second electrical conductor is, the greater the change in the discharge current over time needs to be in order to generate a sufficient enough change in the magnetic field over time to switch on the thyristor. In other words, the method can proceed in such a way that the thyristor is switched on by the induced current when the change in the discharge current over time exceeds a threshold value.

The method can be configured in such a way that the electronic circuit has at least two electronic switching elements (which can be switched on and off), which are arranged in a half-bridge circuit (wherein the half-bridge circuit is connected in parallel with the energy storage unit). Such an electronic circuit is included, for example, in so-called half-bridge submodules of a modular multilevel converter.

The method can also be configured in such a way that the electronic circuit has the two electronic switching elements and two further electronic switching elements (which can be switched on and off), wherein the two electronic switching elements and the two further electronic switching elements are arranged in a full-bridge circuit. Such an electronic circuit is included, for example, in so-called full-bridge submodules of a modular multilevel converter.

Also disclosed is an arrangement comprising an electronic circuit and an electric energy storage unit, which is connected to the electronic circuit by means of a first electrical conductor and a second electrical conductor, and comprising a thyristor for discharging the energy storage unit (in the event of a fault), wherein the thyristor is arranged physically adjacent to the first electrical conductor and/or the second electrical conductor in such a way that, owing to a magnetic field which changes over time, which arises owing to a discharge current of the energy storage unit flowing through at least one of the electrical conductors (for example owing to a discharge current of the energy storage unit flowing through the first electrical conductor and/or the second electrical conductor), and which passes through the semiconductor material of the thyristor, a current (eddy current) is induced (impressed) in the semiconductor material of the thyristor, said current switching on the thyristor (when the change in the magnetic field over time exceeds a threshold value). In this case, the energy storage unit may be, for example, a capacitor-like energy storage unit, for example an electrical capacitor, an electric battery or a rechargeable electric battery. The induced current can act as a gate current or as a trigger current in the thyristor. This arrangement has the same advantages as those specified above in connection with the method.

The arrangement can also be configured in such a way that the thyristor is arranged in an interspace between the first electrical conductor and the second electrical conductor. In this arrangement, both the magnetic field of the first electrical conductor and the magnetic field of the second electrical conductor pass through the thyristor particularly well.

The arrangement can also be configured in such a way that the anode of the thyristor is (electrically conductively) connected to the first electrical conductor, and the cathode of the thyristor is (electrically conductively) connected to the second electrical conductor. In other words, the thyristor is connected directly between the first electrical conductor and the second electrical conductor. In this case, advantageously only two contact points (one contact point between the anode and the first electrical conductor, one contact point between the cathode and the second electrical conductor) are required.

The arrangement can also be configured in such a way that the thyristor is mechanically braced between the first electrical conductor and the second electrical conductor (the first electrical conductor, the thyristor, and the second electrical conductor form a bracing assembly). Owing to the mechanical bracing, advantageously good electrical contact is ensured between the first electrical conductor and the thyristor (more precisely between the first electrical conductor and the anode of the thyristor) and the second electrical conductor and the thyristor (more precisely between the second electrical conductor and the cathode of the thyristor).

The arrangement can also be configured in such a way that the thyristor has a disk-type housing. Such a thyristor having a disk-type housing can advantageously be mechanically braced particularly easily between the first electrical conductor and the second electrical conductor.

The arrangement can also be configured in such a way that the first electrical conductor and/or the second electrical conductor are each configured as a busbar. Firstly, a high discharge current of the energy storage unit can be conducted safely by means of such a busbar; secondly, the thyristor can be mechanically braced reliably by means of a (mechanically stable) busbar.

The arrangement can also be configured in such a way that the first electrical conductor and/or the second electrical conductor each have a planar outer surface, the semiconductor material of the thyristor forms a wafer, and the wafer is arranged parallel to at least one of the planar outer surfaces (in this case, in particular the first electrical conductor can have a first planar outer surface, the second electrical conductor can have a second planar outer surface, the first planar outer surface can be arranged parallel to the second planar outer surface, the semiconductor material of the thyristor can form a wafer, and the wafer can be arranged parallel to the first planar outer surface and to the second planar outer surface). Such an arrangement advantageously enables a small distance between the first electrical conductor and the second electrical conductor. As a result, a particularly strong magnetic field can be generated between the first electrical conductor and the second electrical conductor. In addition, it has been shown that, given such an arrangement, the magnetic field which changes over time passes through the semiconductor material of the thyristor particularly well, with the result that the current (which acts, for example, as gate current) is induced reliably in the semiconductor material of the thyristor.

The arrangement can also be configured in such a way that the thyristor is connected with a low inductance to the energy storage unit (in this case the electrical connection between the energy storage unit and the thyristor has a lower electrical inductance than the electrical connection between the energy storage unit and the electronic circuit). In this case, it is particularly advantageous that, after switching-on of the thyristor, the discharge current of the energy storage unit flows through the thyristor and not (or only to a small extent) through the electronic circuit.

The arrangement can also be configured in such a way that the thyristor is connected in parallel with the energy storage unit. This makes it possible to arrange the thyristor particularly close to the energy storage unit, as a result of which a particularly low-inductance electrical connection between the energy storage unit and the thyristor is possible.

The arrangement can also be configured in such a way that the electronic circuit has at least two electronic switching elements (which can be switched on and off), which are arranged in a half-bridge circuit (wherein the half-bridge circuit is connected in parallel with the energy storage unit). Such an electronic circuit is included, for example, in so-called half-bridge submodules of a modular multilevel converter.

The arrangement can also be configured in such a way that the electronic circuit has the two electronic switching elements and two further electronic switching elements (which can be switched on and off), wherein the two electronic switching elements and the two further electronic switching elements are arranged in a full-bridge circuit. Such an electronic circuit is included, for example, in so-called full-bridge submodules of modular multilevel converters.

Also disclosed is a module of a modular multilevel converter, which has an arrangement as claimed in one of the above-described variants.

In addition, a modular multilevel converter comprising a multiplicity of such modules is disclosed.

The described method and the described arrangement have the same or similar advantages.

BRIEF DESCRIPTION OF THE SEVERAL VIEWS OF THE DRAWING

The invention will be explained in more detail below with reference to exemplary embodiments. Here, the same reference symbols relate to identical or functionally identical elements. In this regard, FIG. 8 shows an exemplary embodiment of a fitted thyristor in a plan view, FIG. 9 shows the exemplary embodiment of the fitted thyristor in a side view, FIG. 10 shows an exemplary illustration of the semiconductor material of the thyristor in the magnetic field, and FIG. 11 shows an exemplary method sequence.

DESCRIPTION OF THE INVENTION

Figure 1:
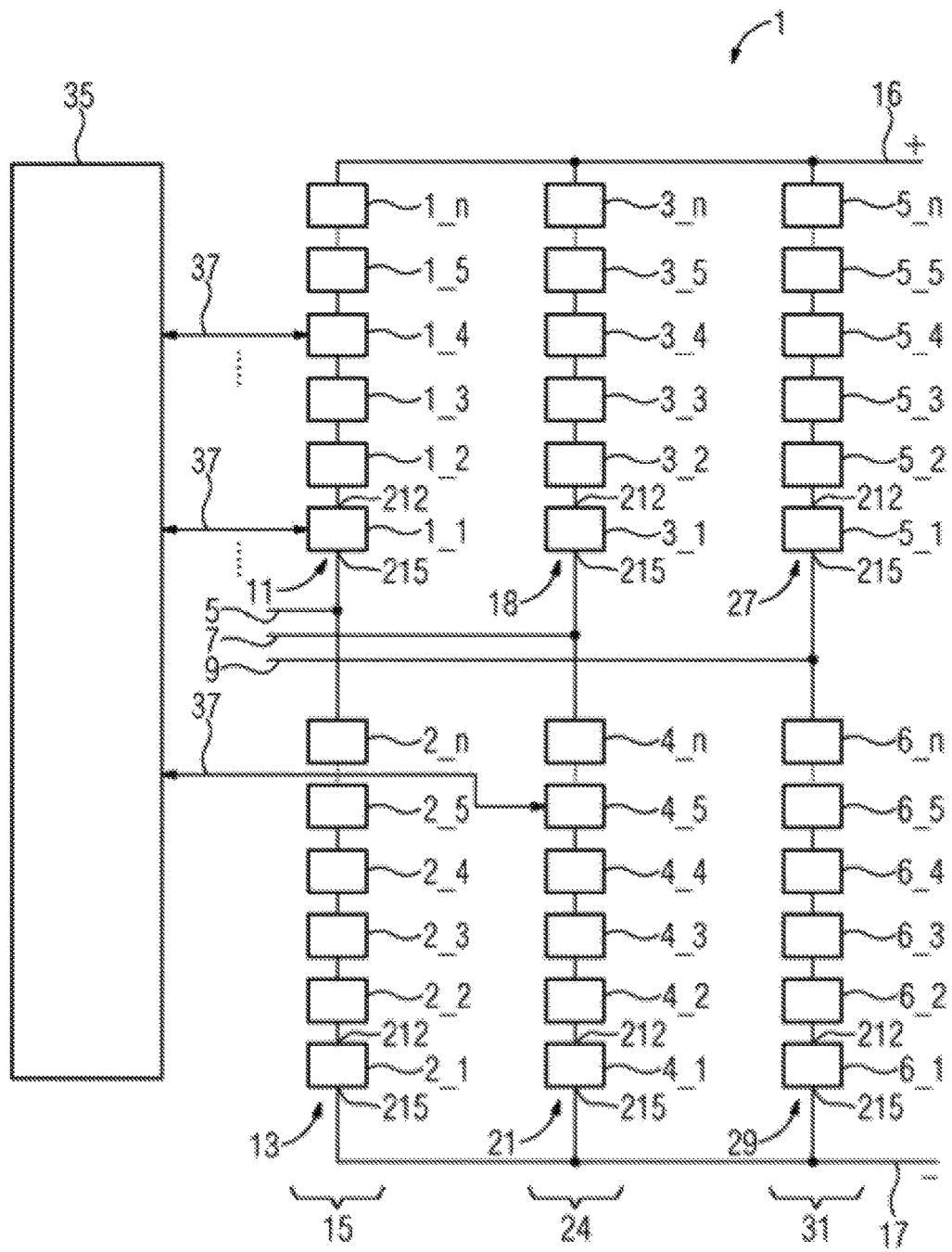
FIG. 1 shows an exemplary embodiment of a converter, which has a multiplicity of modules.

FIG. 1 shows a converter 1 in the form of a modular multilevel converter 1 (MMC). This multilevel converter 1 has a first AC voltage terminal 5, a second AC voltage terminal 7 and a third AC voltage terminal 9. The first AC voltage terminal 5 is electrically connected to a first phase module branch 11 and a second phase module branch 13. The first phase module branch 11 and the second phase module branch 13 form a first phase module 15 of the converter 1. That end of the first phase module branch 11 which faces away from the first AC voltage terminal 5 is electrically connected to a first DC voltage terminal 16; that end of the second phase module branch 13 which faces away from the first AC voltage terminal 5 is electrically connected to a second DC voltage terminal 17. The first DC voltage terminal 16 is a positive DC voltage terminal; the second DC voltage terminal 17 is a negative DC voltage terminal.

The second AC voltage terminal 7 is electrically connected to one end of a third phase module branch 18 and to one end of a fourth phase module branch 21. The third phase module branch 18 and the fourth phase module branch 21 form a second phase module 24. The third AC voltage terminal 9 is electrically connected to one end of a fifth phase module branch 27 and to one end of a sixth phase module branch 29. The fifth phase module branch 27 and the sixth phase module branch 29 form a third phase module 31.

That end of the third phase module branch 18 which faces away from the second AC voltage terminal 7 and that end of the fifth phase module branch 27 which faces away from the third AC voltage terminal 9 are electrically connected to the first DC voltage terminal 16. That end of the fourth phase module branch 21 which faces away from the second AC voltage terminal 7 and that end of the sixth phase module branch 29 which faces away from the third AC voltage terminal 9 are electrically connected to the second DC voltage terminal 17.

Each phase module branch has a plurality of modules (1_1, 1_2, 1_3, 1_4 ... 1_n; 2_1 ... 2_n; etc.), which are connected electrically in series (by means of their galvanic electrical terminals). Such modules are also referred to as submodules. In the exemplary embodiment in FIG. 1, each phase module branch has n modules. The number of modules connected electrically in series by means of their galvanic electrical terminals may be very different; it is at least the case that three modules are connected in series, but it is also possible for, for example, 50, 100 or more modules to be connected electrically in series. In the exemplary embodiment, n=36: i.e. the first phase module branch 11 has 36 modules 1_1, 1_2, 1_3, ... 1_36. The other phase module branches 13, 18, 21, 27 and 29 have an identical design.

The left-hand region of FIG. 1 shows schematically a control device 35 for the modules 1_1 to 6_n. Visual messages are transmitted from this central control device 35 via an optical communications link 37 (for example via a fiberoptic conductor) to the individual modules. The message transmission between the control device and a module is illustrated in each case symbolically by a line 37; the direction of the message transmission is symbolized by the arrow tips on the lines 37. This is illustrated using the example of the modules 1_1, 1_4 and 4_5; messages are sent to the other modules, or messages are received from these modules, in the same way. For example, the control device 35 sends in each case a setpoint value to the individual modules in respect of the level of the output voltage intended to be provided by the respective module.

Figure 2:
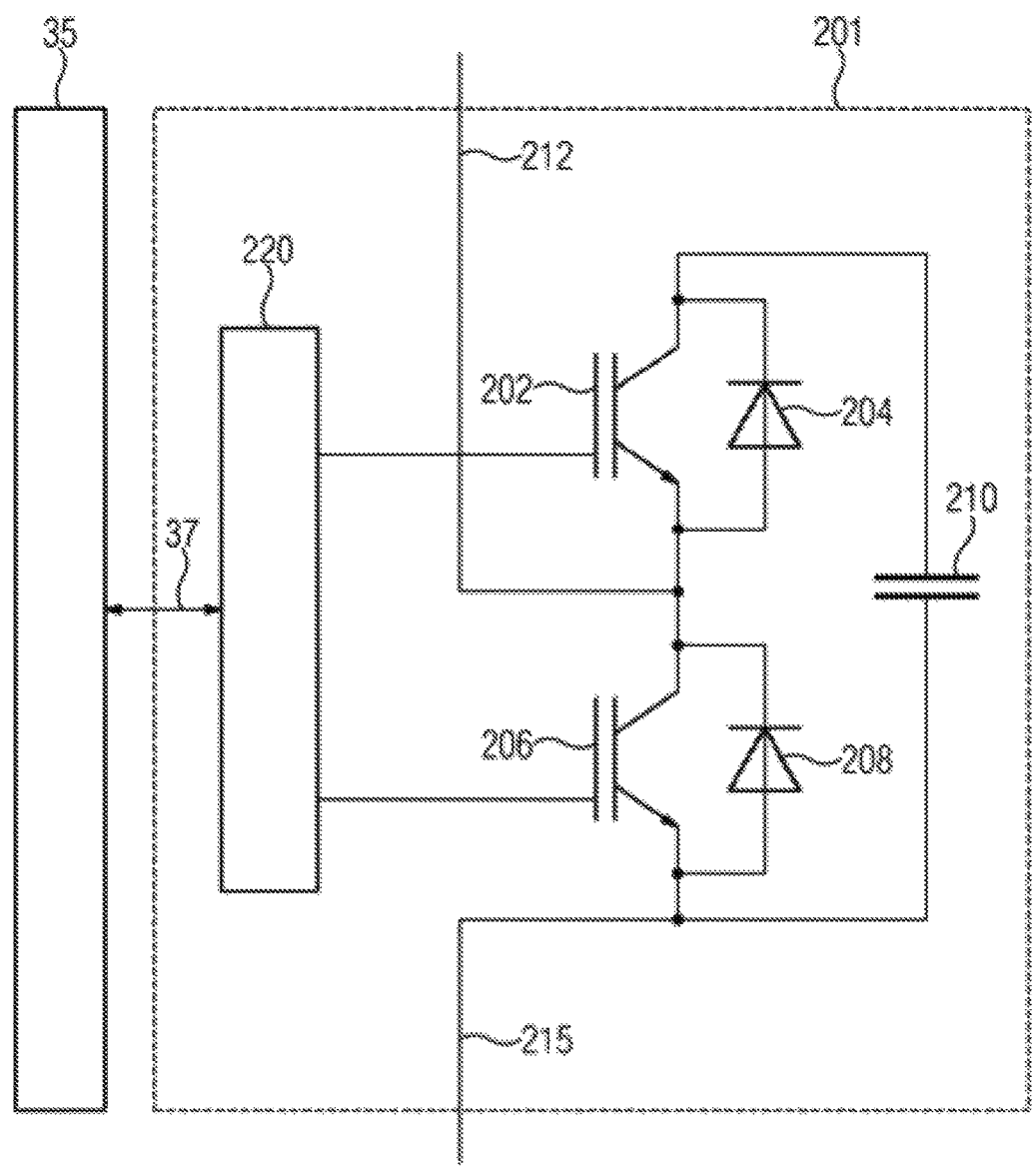
FIG. 2 shows an exemplary embodiment of a module.

FIG. 2 illustrates, by way of example, the design of a module 201. This may be, for example, the module 1_1 of the first phase module branch 11 (or else one of the other modules illustrated in FIG. 1). The module is configured as a half-bridge module 201. The module 201 has a first electronic switching element 202 which can be switched on and off (switching element 202 which can be switched on and off) having a first diode 204 connected back-to-back in parallel. Furthermore, the module 201 has a second electronic switching element 206 which can be switched on and off (switching element 206 which can be switched on and off) having a second diode 208 connected back-to-back in parallel and an electric energy storage unit 210 in the form of a capacitor 210. The first electronic switching element 202 and the second electronic switching element 206 are each configured as an IGBT (insulated-gate bipolar transistor). The first electronic switching element 202 is connected electrically in series with the second electronic switching element 206. A first galvanic module terminal 212 is arranged at the node between the two electronic switching elements 202 and 206. A second galvanic module terminal 215 is arranged at that terminal of the second switching element 206 which is opposite the node. The second module terminal 215 is furthermore connected to a first terminal of the energy storage unit 210; a second terminal of the energy storage unit 210 is electrically connected to that terminal of the first switching element 202 which is opposite the node.

The energy storage unit 210 is therefore connected electrically in parallel with the series circuit comprising the first switching element 202 and the second switching element 206. By virtue of corresponding driving of the first switching element 202 and the second switching element 206 by the module-internal electronic module control device 220, it is possible to achieve a situation whereby either the voltage of the energy storage unit 210 is output or no voltage is output (i.e. a zero voltage is output) between the first galvanic module terminal 212 and the second galvanic module terminal 215. By interaction of the modules of the individual phase module branches, the respectively desired output voltage of the converter can thus be generated.

Figure 3:
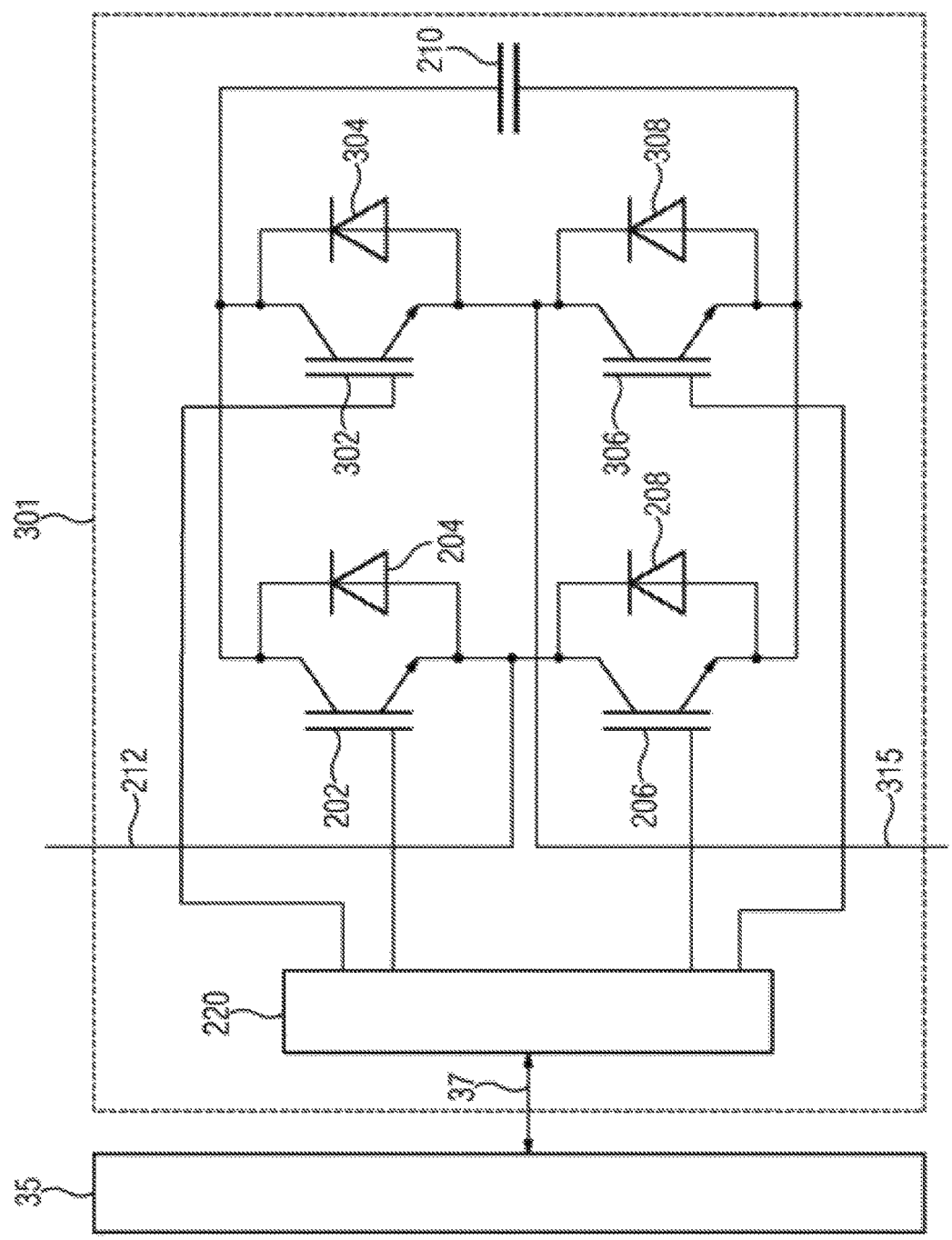
FIG. 3 shows a further exemplary embodiment of a module.

FIG. 3 shows a further exemplary embodiment of a module 301 of the modular multilevel converter 1. This module 301 may be, for example, the module 1_2 (or else one of the other modules illustrated in FIG. 1). In addition to the first switching element 202, second switching element 206, first diode 204, second diode 208 and energy storage unit 210 already known from FIG. 2, the module 301 illustrated in FIG. 3 has a third electronic switching element 302 which can be switched on and off having a third diode 304 connected back-to-back in parallel and a fourth electronic switching element 306 which can be switched on and off having a fourth diode 308 connected back-to-back in parallel. The third switching element 302 which can be switched on and off and the fourth switching element 306 which can be switched on and off are each in the form of an IGBT. In contrast to the circuit in FIG. 2, the second galvanic module terminal 315 is not electrically connected to the second switching element 206, but to a mid-point in an electrical series circuit comprising the third switching element 302 and the fourth switching element 306.

The module 301 in FIG. 3 is a so-called full-bridge module 301. This full-bridge module 301 is characterized by the fact that on corresponding driving of the four switching elements, optionally either the positive voltage of the energy storage unit 210, the negative voltage of the energy storage unit 210 or a voltage of the value zero (zero voltage) can be output between the first galvanic module terminal 212 and the second galvanic module terminal 315. Therefore, the polarity of the output voltage can thus be reversed by means of the full-bridge module 301. The converter 1 can have either only half-bridge modules 201, only full-bridge modules 301 or else half-bridge modules 201 and full-bridge modules 301. High electrical currents of the converter flow via the first galvanic module terminal 212 and the second galvanic module terminal 215, 315.

Figure 4:
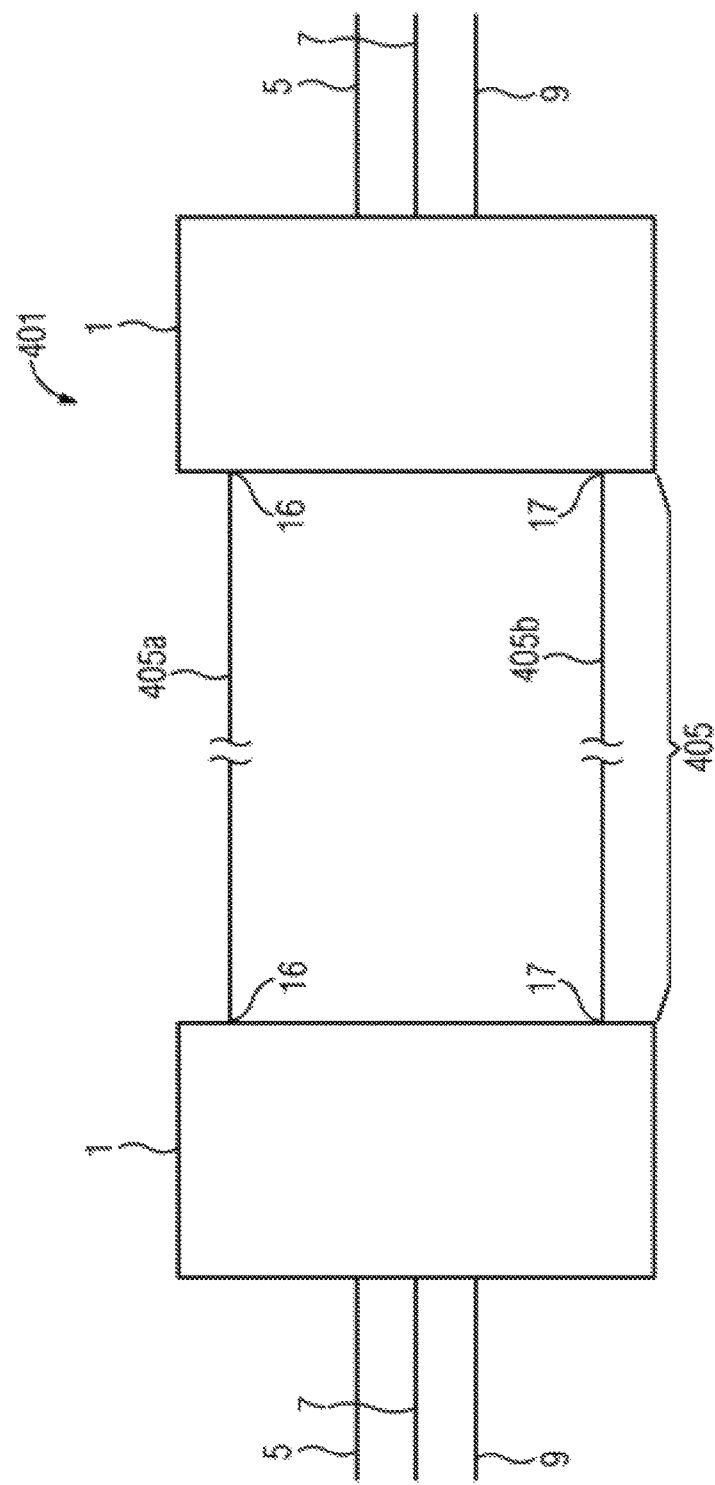
FIG. 4 shows an exemplary embodiment of an HVDC transmission system.

FIG. 4 shows schematically an exemplary embodiment of an HVDC transmission system 401. This HVDC transmission system 401 has two converters 1, as are illustrated in FIG. 1. These two converters 1 are electrically connected to one another on the DC-voltage side via an HVDC link 405. In this case, the two positive DC voltage terminals 16 of the converters 1 are electrically connected to one another by means of a first HVDC line 405a; the two negative DC voltage terminals 17 of the two converters 1 are electrically connected to one another by means of a second HVDC line 405b. Electrical energy can be transmitted over long distances by means of such an HVDC transmission system 401; the HVDC link 405 then has a corresponding length.

Figure 5:
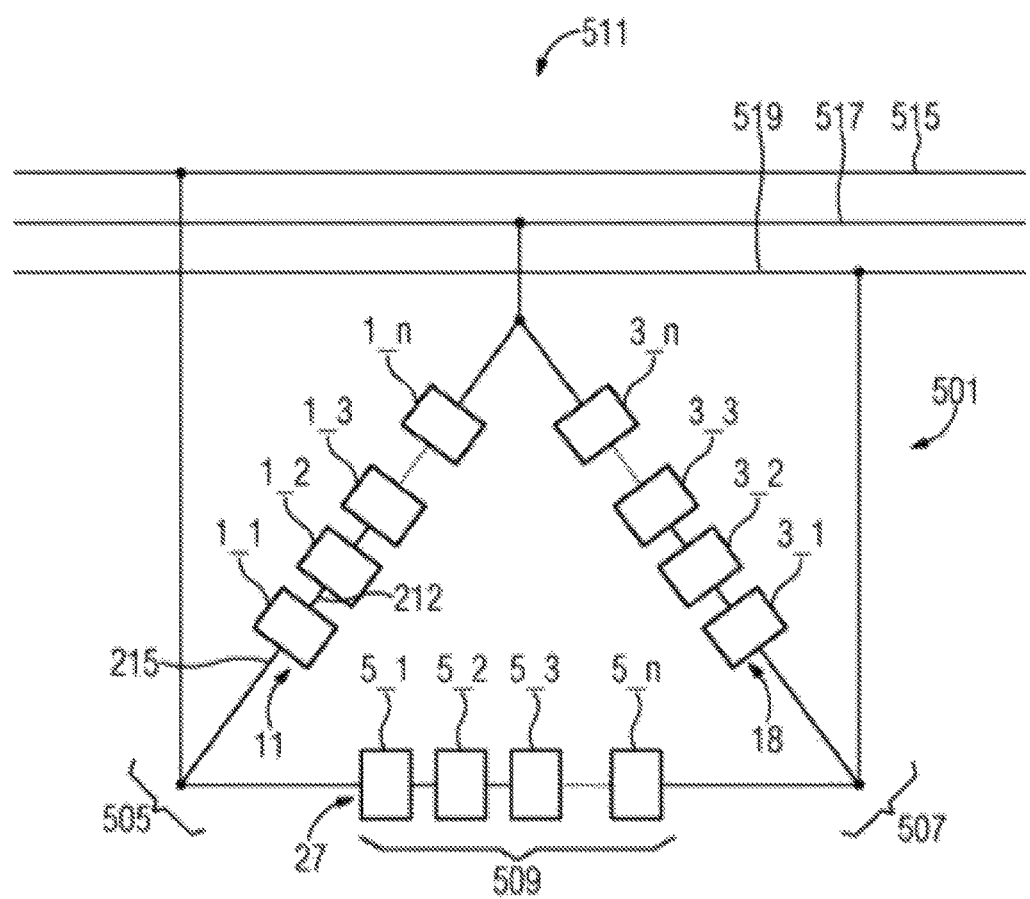
FIG. 5 shows an exemplary embodiment of a power factor correction system.

FIG. 5 shows an exemplary embodiment of a converter 501, which acts as a power factor correction device 501. This converter 501 has only the three phase module branches 11, 18 and 27, which form three phase modules 505, 507 and 509 of the converter. The number of phase modules 505, 507 and 509 corresponds to the number of phases in an AC voltage system 511 to which the converter 501 is connected.

The three phase module branches 11, 18 and 27 are star-connected to one another. That end of the three phase module branches which is opposite the neutral point is electrically connected to in each case one phase line 515, 517 and 519 of the three-phase AC voltage system 511 (the three phase modules 505, 507 and 509 can, in another exemplary embodiment, also be delta-connected instead of star-connected). The converter 501 can supply reactive power to the AC voltage system 511 or draw reactive power from the AC voltage system 511.

Figure 6:
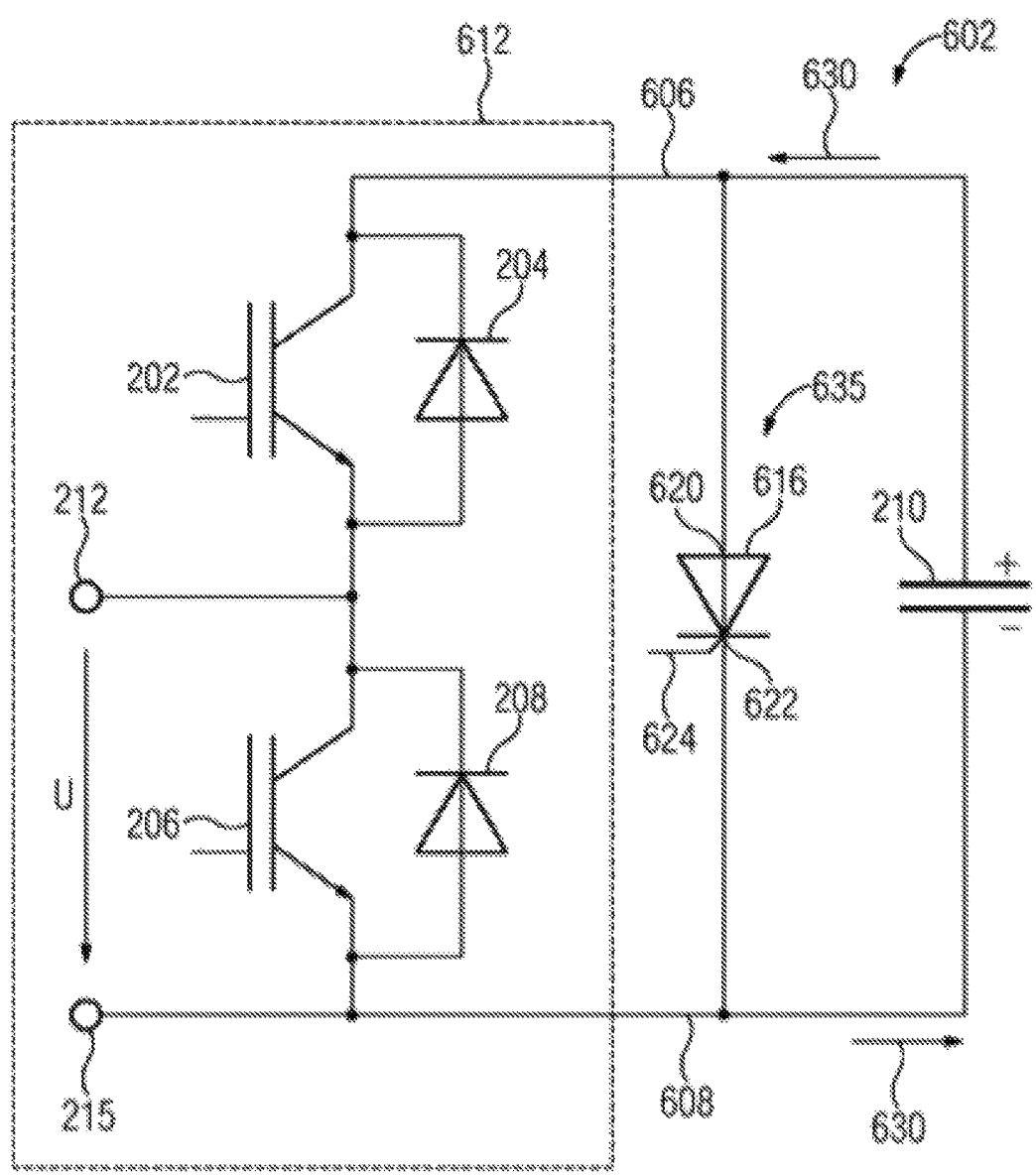
FIG. 6 shows an exemplary embodiment of a module comprising a thyristor.

FIG. 6 shows an arrangement 602 comprising the electric energy storage unit 210. The energy storage unit 210 in the exemplary embodiment is an electrical capacitor 210, to be more precise a unipolar electrical capacitor (having a positive capacitor terminal (+) and a negative capacitor terminal (−)). The energy storage unit 210 can, however, in other exemplary embodiments, also be a different type of capacitor, an electric battery or a rechargeable electric battery. The arrangement 602 may be, for example, the module 1_2 (or else one of the other modules illustrated in FIG. 1). The arrangement 602 has the basic design of the module 201 illustrated in FIG. 2.

The electric energy storage unit 210 is connected to an electronic circuit 612 (power electronics circuit 612) by means of a first electrical conductor 606 (first electrical connection 606) and a second electrical conductor 608 (second electrical connection 608). The first electrical conductor 606 is a positive electrical conductor; the second electrical conductor 608 is a negative electrical conductor.

The electronic circuit 612 has the first electronic switching element 202, the second electronic switching element 206, the first diode 204 connected back-to-back in parallel and the second diode 208 connected back-to-back in parallel, which are already known from FIG. 2. Furthermore, the arrangement 602 has a thyristor 616, which is connected in parallel with the electric energy storage unit 210. An anode 620 (anode terminal 620) of the thyristor is electrically connected to the first electrical conductor 606. A cathode 622 (cathode terminal 622) of the thyristor is electrically connected to the second electrical conductor 608. A gate 624 (gate terminal 624) of the thyristor is unwired in the exemplary embodiment. In other words, this gate 624 is open, i.e. not connected to other components. The thyristor 616 is a protective thyristor 616 for conducting a discharge current 630 of the electric energy storage unit 210 in the event of a fault. The thyristor 616 conducts the discharge current 630 of the electric energy storage unit 210 past the electronic circuit 612 in the event of a fault and thereby protects the electronic circuit 612 from the (generally very high) discharge current 630 of the electric energy storage unit 210.

Such a thyristor is also referred to as a crowbar thyristor. The discharge current 630 can also be referred to as a short-circuit-like discharge current 630 or as a short-circuit current 630.

In the arrangement 602, the following method proceeds in the event of a fault: as a starting point it is assumed that the electric energy storage unit 210 is charged. The thyristor 616 is switched off (not turned on), i.e. the thyristor 616 prevents current flow. Thereupon, a fault occurs in the electronic circuit 612: for example, the first electronic switching element 202 and the second electronic switching element 206 (undesirably) become electrically conductive at the same time (a so-called bridge short circuit occurs in the half bridge formed by the first electronic switching element 202 and the second electronic switching element 206). As a result, the electric energy storage unit 210 is short-circuited, and the discharge current 630 begins to flow suddenly.

The discharge current 630 flows first starting from the energy storage unit 210 via the first electrical conductor 606 to the electronic circuit 612. There, the discharge current 630 flows via the first electronic switching element 202 and the second electronic switching element 206. Then, the discharge current 630 flows via the second electrical conductor 608 back to the energy storage unit 210. In this case, the charging current in the first electrical conductor 606 and in the second electrical conductor 608 each have opposite directions. The discharge current 630 is only limited by leakage capacitances and nonreactive resistances which occur in the first electrical conductor, the second electrical conductor and the electronic circuit 612. Therefore, the discharge current 630 increases relatively quickly.

Owing to the (increasing) discharge current 630, a magnetic field which changes over time is generated around the first electrical conductor 606. Owing to the discharge current 630, a magnetic field which changes over time is also generated around the second electrical conductor 608. These two magnetic fields are superimposed on one another and both pass through the thyristor 616 and therefore the semiconductor material of the thyristor 616. That is to say that the thyristor is arranged physically adjacent to the first electrical conductor and the second electrical conductor (the thyristor 616 has an outer housing consisting of an anti-magnetic material which does not inhibit, or only inhibits to a small extent, the magnetic field passing through the thyristor 616).

Owing to the magnetic field which changes over time, a current, for example an eddy current, is induced in the semiconductor material of the thyristor. This current acts as a gate current (internal gate current, inner gate current) or trigger current and effects switching-on of the thyristor 616 (i.e. triggering of the thyristor 616). Owing to the switching-on of the thyristor 616, the discharge current 630 now no longer flows via the electronic circuit 612, but via the thyristor 616. To be more precise, the discharge current 630 now flows from the energy storage unit 210 via part of the first electrical conductor 606 to the anode 620 of the thyristor and from the cathode 622 of the thyristor via part of the second electrical conductor 608 back to the energy storage unit 210. The discharge current 630 flows via the thyristor 616 because the thyristor 616 is electrically connected with a low inductance to the energy storage unit 210. That is to say that the electrical connection between the thyristor 616 and the energy storage unit 210 has a lower electrical inductance than the first electrical conductor 606 and the second electrical conductor 608, which connect the energy storage unit 210 to the electronic circuit 612.

The thyristor 616 is therefore switched on by the induced current (eddy current). The gate 624 can in this case be unwired. The gate 624 does not even need to be brought out of the thyristor. The thyristor is in particular only switched on by the induced current (gate current or trigger current) when the change in the magnetic field over time exceeds a threshold value. Critical here is the change in the magnetic field over time at the location of the semiconductor material of the thyristor. Particularly great changes in the magnetic field over time can be realized at the semiconductor material of the thyristor when the thyristor is arranged very close to the first electrical conductor 606 and/or to the second electrical conductor 608. Great changes in the magnetic field over time can also be realized by virtue of the fact that the distance between the first electrical conductor 606 and the second electrical conductor 608 is short and that the thyristor 616 is arranged in an interspace 635 between the first electrical conductor 606 and the second electrical conductor 608. In other words, the thyristor is switched on by the induced current (gate current or trigger current) when the change in the discharge current (in the first electrical conductor 606 and/or the second electrical conductor 608) over time exceeds a threshold value. This threshold value may be, for example, a value of between 5 and 50 kA/µs.

Owing to the discharge current 630 flowing through the thyristor 616, the thyristor 616 may be thermally overloaded and thus destroyed. In the event of a fault, therefore, the thyristor acts as a sacrificial element in order to protect the electronic circuit 612 from the discharge current 630. After the occurrence of a fault (i.e. once the discharge current 630 has been conducted away via the thyristor 616), the thyristor 616 therefore needs to be replaced. In particular, the thyristor 616 has a so-called conduct-on-fail property, i.e. in the event of a fault (and also in the event of destruction owing to overload) the thyristor 616 remains conductive and is therefore capable of conducting the discharge current 630 until it has decayed. Such thyristors with a conduct-on-fail property are commercially available.

As an alternative to the unwired gate (or even one which has not been brought out of the thyristor at all), the gate 624 can even be closed off by means of a constant impedance which is not equal to zero. As a further alternative, it is, however, also possible for a drive unit to be connected to the gate 624, said drive unit feeding a gate current into the gate 624 of the thyristor in the event of a discharge-free fault (i.e. in the event of a fault which is not associated with discharge of the energy storage unit 210 or with a short-circuit-like discharge current 630 of the energy storage unit). Such a discharge-free fault may be, for example, overloading of the energy storage unit 210, which does not result directly in a short-circuit-like discharge current 630, but should nevertheless be prevented.

Figure 7:
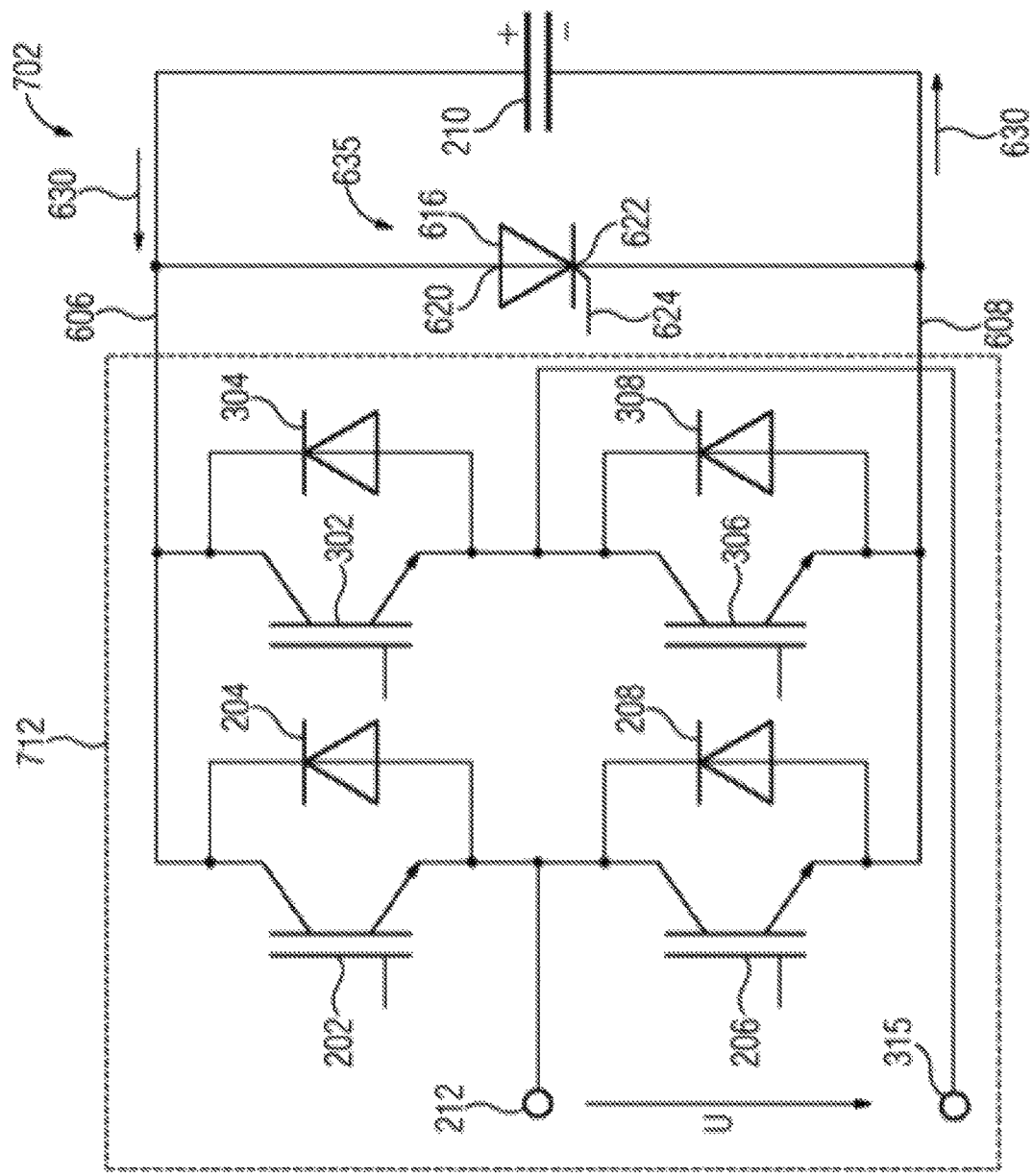
FIG. 7 shows a further exemplary embodiment of a module comprising a thyristor.

FIG. 7 shows a further exemplary embodiment of an arrangement 702. The arrangement 702 may be, for example, the module 1_2 (or else one of the other modules illustrated in FIG. 1). The arrangement 702 has the basic design of the module 301 illustrated in FIG. 3.

The arrangement 702 differs from the arrangement 602 in FIG. 6 merely in that the arrangement 702 has an electronic circuit 712 which differs from the electronic circuit 612: the electronic circuit 712 additionally has a third electronic switching element 302 having a third diode 304 connected back-to-back in parallel and a fourth electronic switching element 306 having a fourth diode 308 connected back-to-back in parallel. The first electronic switching element 202, the second electronic switching element 206, the third electronic switching element 302 and the fourth electronic switching element 306 are in this case connected in a full-bridge circuit. In the case of the electronic circuit 712, for example, a fault may occur which results in the third electronic switching element 302 and the fourth electronic switching element 306 becoming electrically conductive simultaneously. Then, the energy storage unit 210 is electrically short-circuited by the third switching element 302 and the fourth switching element 306, and the discharge current 630 begins to flow from the energy storage unit 210 to the electronic circuit 712. The method further proceeds in the same way as the method explained in connection with FIG. 6.

FIG. 8 shows an exemplary embodiment of an arrangement 802 of the thyristor 616 between the first electrical conductor 606 and the second electrical conductor 608. The first electrical conductor 606 and the second electrical conductor 608 are in this case configured as a first busbar 606 and a second busbar 608. The first electrical busbar 606 and the second electrical busbar 608 each have a flat profile. In the left-hand part of FIG. 8, the electronic circuit 612 is illustrated schematically as a block 612; in the right-hand part of FIG. 8, the energy storage unit 210 is illustrated schematically as a block 210. Instead of the electronic circuit 612, the electronic circuit 712 can also be used.

The first electrical conductor 606 (first electrical busbar 606) connects the energy storage unit 210 to the electronic circuit 612. The second electrical conductor 608 (second electrical busbar 608) connects the energy storage unit 210 to the electronic circuit 612. The thyristor 616 is mechanically braced between the first electrical conductor 606 and the second electrical conductor 608. Therefore, the thyristor 616 is located in the interspace 635 between the first electrical conductor 606 and the second electrical conductor 608. The anode 620 of the thyristor 616 bears against the first electrical conductor 606, and the cathode 622 of the thyristor 616 bears against the second electrical conductor 608. The bracing is implemented by means of a bracing apparatus 806. In the exemplary embodiment, the bracing apparatus 806 has two bolts, which mechanically brace the first electrical conductor 606, the thyristor 616 and the second electrical conductor 608 by means of in each case one nut. The first electrical conductor 606, the thyristor 616 and the second electrical conductor 608 form a bracing assembly. This bracing assembly or the mechanical bracing effect good electrical contact between the first electrical conductor 60 and the thyristor 616 and good electrical contact the second electrical conductor 608 and the thyristor 616. In addition, owing to the bracing or the bracing assembly, the arrangement is mechanically so stable that the arrangement can reliably absorb the electromechanical forces acting owing to the high discharge current.

It can clearly be seen that the physical height of the thyristor 616 approximately corresponds to the distance between the first electrical conductor 606 and the second electrical conductor 608. The anode 620 and the cathode 622 each form a bracing surface of the thyristor 616. The lines of force of the magnetic flux density B run parallel to the bracing surfaces of the thyristor 616 (not illustrated in FIG. 8; cf. FIG. 10). The electrical field (E field) is perpendicular to the field of the magnetic flux density B, but is not illustrated in the figures. For example, it is conceivable that the thyristor 616 can be switched on by means of a discharge current 630 which increases very quickly from zero to approximately 20 kA, i.e. a discharge current with a maximum value of greater than approximately 20 kA, which increases to its maximum value in a very short period of time (less than 1 μs-2 μs), results in switching-on of the thyristor 616.

In the exemplary embodiment in FIG. 8, the thyristor 616 has the form of a disk; the thyristor 616 has a disk-type housing 810. In other words, the thyristor has a wafer-shaped configuration, wherein the base surface forms the cathode and the top surface forms the anode. Using such disk-type thyristors, it is possible to implement particularly mechanically stable bracing assemblies. The illustration in FIG. 8 also shows that the gate 624 of the thyristor is unwired. In contrast to the illustration in FIG. 8, the gate 624 does not need to be brought out of the housing 810 of the thyristor 616 at all because it is unwired.

FIG. 9 shows the arrangement 802 from FIG. 8 in a side view. In this case, the circumference of the disk-type thyristor 616 is indicated by means of a dashed line.

FIG. 10 shows the arrangement 802 in a plan view, similar to the illustration in FIG. 8. However, in FIG. 10, the bracing apparatus 806, the housing of the thyristor 616 and the electrical connections between the anode and the first electrical conductor and between the cathode and the second electrical conductor have been omitted; only the semiconductor material 1006 of the thyristor 616 is illustrated. This semiconductor material 1006 forms a wafer 1006 (wafer-shaped semiconductor material 1006, semiconductor material wafer 1006). The wafer 1006 is illustrated in cross section. In the side view, the wafer 1006 has a circular configuration similar to the circumference of the thyristor 616 in FIG. 9. The semiconductor material 1006 has been illustrated as being excessively thick for reasons of improved clarity. The relevant semiconductor structures (in particular silicon structures) in this semiconductor material 1006 are often very thin, for example only a few 100 μm thick.

Further illustrated are the lines of force of the magnetic field 1010 which form in the interspace 635 between the first electrical conductor 606 and the second electrical conductor 608 (lines of force 1010 of the magnetic flux density B). The lines of force 1010 of the magnetic field come out of the plane of the drawing and point towards the viewer; the viewer looks, so to speak, from the front onto the tip of the lines of force. Since the first electrical conductor 606 and the second electrical conductor 608 are in the form of plates, parallel lines of force 1010 form in the interspace 635 between the first electrical conductor 606 and the second electrical conductor 608. The lines of force 1010 pass through the semiconductor material 1006 of the thyristor. Owing to the magnetic field 1010 which changes over time, a voltage 1016 is induced in the semiconductor material 1006, said voltage resulting in the flow of a current 1018 (eddy current 1018) in the semiconductor material 1006 of the thyristor. The voltage 1016 and the current 1018 are only illustrated schematically here. The induced current 1018 acts as a gate current 1018 of the thyristor or as a trigger current of the thyristor and switches on the thyristor 616 (i.e. the current 1018 triggers the thyristor 616).

The first electrical conductor 606 has a first planar outer surface 1024. The second electrical conductor 608 has a second planar outer surface 1026. The first planar outer surface 1024 and the second planar outer surface 1026 are arranged parallel to one another. The wafer-shaped semiconductor material 1006 of the thyristor 616 is arranged parallel to the first outer surface 1024 and likewise parallel to the second outer surface 2026. This arrangement of the semiconductor material 1006 enables a compact and mechanically stable design of the arrangement 802. In addition, a considerable change in the magnetic field over time at the location of the semiconductor material 1006 arises (owing to the small distance which is thus possible between the first electrical conductor 606 and the second electrical conductor 608).

In other words, the wafer 1006 (the silicon wafer 1006 of the thyristor) represents a conductive material. As soon as the magnetic field B 1010 which changes over time has passed through the wafer, the current 1018 (in particular an eddy current) is generated in the surface of the wafer. This current results in the thyristor 616 turning on, i.e. being switched on. The higher the short-circuit-like discharge current 630 flowing, the greater the magnetic flux density B thus generated as well.

FIG. 11 once again shows the method for discharging the energy storage unit by means of a flowchart. The starting point for the method is that the energy storage unit is charged and the thyristor is in the switched-off state (off state).

Method Step 1102:

After the occurrence of a fault in the electronic circuit 612, beginning of the flow of the discharge current 630 of the energy storage unit 210. The discharge current 630 flows from the energy storage unit 210 via the first electrical conductor 606 to the electronic circuit 612 and via the second electrical conductor 608 back to the energy storage unit 210.

Method Step 1104:

Generation of a magnetic field 1010 which changes over time around the first electrical conductor 606 and/or around the second electrical conductor 608 owing to the increasing discharge current 630, wherein the magnetic field 1010 passes through the semiconductor material 1006.

Method Step 1106:

Induction of a current 1018 in the semiconductor material 1006 of the thyristor 616 by the magnetic field 1010 which changes over time. The current 1018 can act as gate current or as trigger current of the thyristor.

Method Step 1008:

Switching-on of the thyristor 616 by the induced current 1018. Thereupon, the discharge current 630 of the energy storage unit 210 flows through the thyristor 616 and is thereby conducted past the electronic circuit 612.

Method Step 1110:

Decay of the discharge current 630 as the discharge of the energy storage unit 210 increases.

A method and an arrangement have been described in which the magnetic field coupled into the thyristor (more precisely the coupled-in magnetic flux density B) passes through the entire thyristor and generates an induced current (eddy current) in the thin semiconductor structure/semiconductor material of the thyristor. Above a threshold value for the change in the magnetic field over time (dB/dt), this current is sufficient for allowing a gate current (or a trigger current) to flow in the semiconductor material and thereby for switching on the thyristor (without an external gate current from an external electronic evaluation circuit being required for this purpose). External driving of the gate is therefore not necessary; the fault identification/short-circuit identification is internal to the thyristor and functions as long as the thyristor is intact. This is a significant advantage since a function test by evaluation circuits in energy storage units with a high capacity is in practice difficult and involved. In particular, the arrangement and the method have a low FIT rate, which substantially corresponds to the FIT rate of thyristors. This FIT rate is very low in the case of thyristors.

In the described arrangement and the described method, the short-circuit-like discharge current 630 of the energy storage unit is used for delay-free triggering of the thyristor without a detection circuit or evaluation circuit being required for this purpose, which would always bring with it a time delay. The technical implementation by means of only one thyristor is extremely simple and inexpensive. On triggering of the thyristor, said thyristor may be destroyed (depending on the level of energy of the energy storage unit which needs to be managed) and may need to be replaced during later maintenance. A comparatively simple disk-type diode housing can be used for the thyristor since the gate terminal 624 is not being used and therefore does not need to be brought out of the housing.

In the described arrangement and the described method, no notable thermal losses are generated, which markedly improves the energy efficiency in comparison with protective elements which generate on-state power losses or switching losses even during normal operation. As a result, the electrical losses from installations which have a multiplicity of the described arrangements (such as, for example, HVDC transmission systems) can be kept low, which results in a considerable cost saving.

A method and an arrangement have been described with which an electric energy storage unit can be discharged safely and reliably, in particular in the event of a short circuit. For this purpose, advantageously no further components are required apart from a thyristor. This enables extremely simple and reliable protection of the electronic circuit from the discharge current of the energy storage unit.

The invention claimed is:

1. A method for discharging an electrical energy storage device, which is connected to an electronic circuit, by way of a first electrical conductor and a second electrical conductor, the method comprising:
   providing a thyristor for discharging the energy storage device;
   when a fault occurs in the electronic circuit, a discharge current of the energy storage device begins to flow from the energy storage device via the first electrical conductor to the electronic circuit and via the second electrical conductor back to the energy storage device;
   generating with the discharge current a temporally varying magnetic field around the first electrical conductor and around the second electrical conductor and causing the magnetic field to pass through a semiconductor material of the thyristor;
   inducing a current in the semiconductor material of the thyristor with the temporally varying magnetic field; and
   switching the thyristor on by the current induced therein.

2. The method according to claim 1, wherein the electronic circuit has at least two electronic switching elements connected in a half-bridge circuit.

3. The method according to claim 1, wherein the electronic circuit has four electronic switching elements connected in a full-bridge circuit.

4. An arrangement, comprising:
   an electronic circuit and an electrical energy storage device connected to said electronic circuit by way of a first electrical conductor and a second electrical conductor;
   a thyristor for discharging said energy storage device;
   said thyristor being arranged physically adjacent at least one of said first electrical conductor or said second electrical conductor such that, when a temporally varying magnetic field is generated by a discharge current flowing from said energy storage device through said first electrical conductor and/or said second electrical conductor, and the magnetic field passes through a semiconductor material of said thyristor, a current is induced in the semiconductor material of said thyristor and said thyristor is switched on.

5. The arrangement according to claim 4, wherein the thyristor is arranged in an interspace between said first electrical conductor and said second electrical conductor.

6. The arrangement according to claim 4, wherein said thyristor has an anode connected to said first electrical conductor and a cathode connected to said second electrical conductor.

7. The arrangement according to claim 4, wherein said thyristor is mechanically braced between said first electrical conductor and said second electrical conductor.

8. The arrangement according to claim 4, wherein said thyristor has a disk-shaped thyristor housing.

9. The arrangement according to claim 4, wherein at least one of said first and second electrical conductors is a busbar.

10. The arrangement according to claim 4, wherein each of said first and second electrical conductors has a planar outer surface, the semiconductor material of said thyristor forms a wafer, and said wafer is arranged parallel to at least one of said planar outer surfaces.

11. The arrangement according to claim 4, wherein said thyristor (616) is connected to said energy storage device with a low inductance.

12. The arrangement according to claim 4, wherein said thyristor is connected in parallel with said energy storage device.

13. The arrangement according to claim 4, wherein said electronic circuit has at least two electronic switching elements connected in a half-bridge circuit.

14. The arrangement according to claim 13, wherein said electronic circuit has said two electronic switching elements and two further electronic switching elements, wherein said two electronic switching elements and said two further electronic switching elements are connected in a full-bridge circuit.

15. A module of a modular multilevel converter, comprising an arrangement according to claim 4.

16. A modular multilevel converter, comprising a multiplicity of modules each comprising an arrangement according to claim 4.

* * * * *